(12) United States Patent
Wan et al.

(10) Patent No.: US 12,235,555 B2
(45) Date of Patent: Feb. 25, 2025

(54) DISPLAY SUBSTRATE, DISPLAY PANEL, AND DISPLAY DEVICE

(71) Applicants: Chongqing BOE Optoelectronics Technology Co., Ltd., Chongqing (CN); BOE Technology Group Co., Ltd., Beijing (CN)

(72) Inventors: Bin Wan, Beijing (CN); Xiaoyuan Wang, Beijing (CN); Xun Pu, Beijing (CN); Junming Chen, Beijing (CN); Yan Liu, Beijing (CN); Dan Lei, Beijing (CN); Guodong Yang, Beijing (CN); Zhicheng Fan, Beijing (CN)

(73) Assignees: Chongqing BOE Optoelectronics Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/561,740

(22) PCT Filed: May 26, 2021

(86) PCT No.: PCT/CN2021/096127
§ 371 (c)(1),
(2) Date: Nov. 17, 2023

(87) PCT Pub. No.: WO2022/246702
PCT Pub. Date: Dec. 1, 2022

(65) Prior Publication Data
US 2024/0272500 A1    Aug. 15, 2024

(51) Int. Cl.
*G02F 1/1362* (2006.01)
*G02F 1/1368* (2006.01)

(52) U.S. Cl.
CPC .... *G02F 1/136286* (2013.01); *G02F 1/13685* (2021.01)

(58) Field of Classification Search
CPC .................................................. G02F 1/1362
See application file for complete search history.

(56) References Cited

U.S. PATENT DOCUMENTS

2015/0173232 A1* 6/2015 Chai ...................... G02F 1/1345
361/748
2021/0111191 A1* 4/2021 Zeng ................... H01L 27/1218

FOREIGN PATENT DOCUMENTS

CN          103399434 A       11/2013
CN          106647071    *    5/2017 ........... G02F 1/1345
(Continued)

OTHER PUBLICATIONS

International Search Report for PCT/CN2021/096127 Mailed Mar. 1, 2022.

*Primary Examiner* — Sang V Nguyen
(74) *Attorney, Agent, or Firm* — Ling Wu; Stephen Yang; Ling and Yang Intellectual Property (57) ABSTRACT

Provided are a display substrate, display panel and display device. The display substrate comprises: a base substrate, comprising a display area and a surrounding area comprising a gluing area; multiple signal lines; multiple fanout lines, connected to multiple signal lines in a one-to-one correspondence manner. The fanout lines comprise: a first fanout line, and a second fanout line located at the side of first fanout line away from the base substrate; at least in the gluing area, the orthographic projection of the second fanout line on the base substrate substantially overlaps that of the first fanout line on the base substrate; in part of the area outside the gluing area, the size of an overlapping area between orthographic projections of the second fanout line and first fanout line on the base substrate in the direction perpendicular to the extension direction of the fanout lines is smaller than a first preset threshold.

19 Claims, 3 Drawing Sheets

(56) References Cited

FOREIGN PATENT DOCUMENTS

| CN | 106647071 A | 5/2017 |
| CN | 107123634 A | 9/2017 |
| CN | 109449169 A | 3/2019 |

\* cited by examiner

DISPLAY SUBSTRATE, DISPLAY PANEL, AND DISPLAY DEVICE

CROSS-REFERENCE TO RELATED APPLICATION

The present application is a U.S. National Phase Entry of International Application No. PCT/CN2021/096127 having an international filing date of May 26, 2021, the content of which is hereby incorporated by reference.

TECHNICAL FIELD

The present disclosure relates to the technical field of display, in particular to a display substrate, a display panel and a display device.

BACKGROUND

With the development of information technology, electronic devices are widely used in people's daily life. Liquid crystal display, as one of the most widely used flat panel displays, occupy an important position in display panels. At present, consumers' demand for narrow borders of display products is getting higher and higher. In order to meet the development requirements of narrow border products, fanout lines are usually designed by double-layer alternative or overlapping metal wiring. However, in the current product design, the double-layer alternative wiring affects the ultraviolet light transmittance, thus affecting the curing effect of sealant. Double-layer overlapping wiring can ensure the curing effect of sealant, but it will increase the capacitance between two layers of metal, thereby increasing the overall power consumption of products. Moreover, double-layer overlapping wiring results in a large segment difference between the metal wires and the panel, which casusing the fanout area is poor in resistant to scratches.

SUMMARY

An embodiment of the present invention provides a display substrate, which includes: a base substrate, a plurality of signal lines, and a plurality of fanout lines.

The base substrate includes a display area and a peripheral area located outside the display area.

The plurality of signal lines are located on a side of the base substrate, and each of the signal lines extends from the display area to the peripheral area. The peripheral area includes a gluing area.

The plurality of fanout lines are located on a same side of the base substrate as the signal lines, and are provided in the peripheral area and are connected with the plurality of signal lines in one-to-one correspondence.

The fanout lines includes: a first fanout line; and a second fanout line, located on a side of the first fanout line away from the base substrate. At least in the gluing area, an orthographic projection of the second fanout line on the base substrate substantially overlaps an orthographic projection of the first fanout line on the base substrate; in part of an area outside the gluing area, the orthographic projection of the second fanout line on the base substrate and the orthographic projection of the first fanout line on the base substrate have a non-overlapping area, and a dimension of an overlapping area of the orthographic projection of the second fanout line on the base substrate and the orthographic projection of the first fanout line on the base substrate in a direction perpendicular to an extension direction of the fanout line is smaller than a first preset threshold.

In some embodiments, the second fanout line includes: a first lead part, a second lead part, and a third lead part. One terminal of the first lead part is connected with the second lead part, and the other terminal of the first lead part is connected with the third lead part.

An orthographic projection of the first lead part on the base substrate and the gluing area have an overlapping area, and both an orthographic projection of the second lead part on the base substrate and an orthographic projection of the third lead part on the base substrate do not overlap the gluing area.

In some embodiments, the orthographic projection of the first lead part on the base substrate overlaps the orthographic projection of the first fanout line on the base substrate, and both the orthographic projection of the second lead part on the base substrate and the orthographic projection of the third lead part on the base substrate do not overlap the orthographic projection of the first fanout line on the base substrate.

In some embodiments, the orthographic projection of the second lead part on the base substrate is connected with orthographic projections of two adjacent first fanout line lines on the base substrate, and the orthographic projection of the third lead part on the base substrate is connected with orthographic projections of two adjacent first fanout line lines on the base substrate.

In some embodiments, line widths of the first fanout line at different positions are equal; a line width of the first lead part, a line width of the second lead part and a line width of the third lead part are all equal; a line width of a connection portion between the first lead part and the second lead part is larger than the line width of the first lead part, and a line width of the connection portion between the first lead part and the third lead part is larger than the line width of the first lead part.

In some embodiments, the line width of the first lead part, the line width of the second lead part, and the line width of the third lead part are equal to the line width of the first fanout line.

In some embodiments, the line width of the first fanout line, and line widths of the first lead part, the second connection lead part, and the third lead part are greater than or equal to 3 microns and less than or equal to 10 microns.

In some embodiments, in an extension direction of the signal lines, a minimum distance between an edge of the gluing area and the second lead part is greater than zero, and a minimum distance between the edge of the gluing area and the third lead part is greater than zero.

In some embodiments, in the extension direction of the signal lines, a minimum distance between the edge of the gluing area and the second lead part is equal to a minimum distance between the edge of the gluing area and the third lead part.

In some embodiments, in the extension direction of the signal lines, a minimum distance between the edge of the gluing area and the second lead part is greater than 0 microns and less than or equal to 200 microns, and a minimum distance between the edge of the gluing area and the third lead part is greater than 0 microns and less than or equal to 200 microns.

In some embodiments, the display substrate further includes: a first insulating layer located between the first fanout line and the second fanout line; and a second insulating layer located on a side of the second fanout line away from the first fanout line. The second insulating layer has a first segment difference and a second segment difference. The first segment difference is a distance between a surface on a side of the second insulating layer covering the second fanout line away from the base substrate and a surface on a side of the second insulating layer between adjacent second fanout lines away from the base substrate in an area where the orthographic projection of the second fanout line on the base substrate does not overlap the orthographic projection of the first fanout line on the base substrate. The second segment difference is a distance between a surface on a side of the second insulating layer covering the second fanout line away from the base substrate and a surface on a side of the second insulating layer between adjacent second fanout lines away from the base substrate in the gluing area. The second segment difference is smaller than the first segment difference.

In some embodiments, the signal lines are data signal lines; the data signal lines are located between the first insulating layer and the second insulating layer and are disposed in a same layer as the second fanout lines.

Each of the second fanout lines is electrically connected with one of the data signal lines, and each of the first fanout lines is electrically connected with one of the data signal lines.

The display substrate further includes: a plurality of scanning signal lines, located on a side of the first insulating layer facing the base substrate and disposed in a same layer as the first fanout lines.

An embodiment of the present invention provides a display panel, including: the display substrate provided by an embodiment of the present disclosure, an alignment substrate, a liquid crystal layer, and sealant.

The alignment substrate is located on a side of the second conductive layer away from the base substrate.

The liquid crystal layer is located between the display substrate and the alignment substrate.

The sealant is located between the display substrate and the alignment substrate. An orthographic projection of the sealant on the display substrate overlaps the gluing area, and an orthographic projection of the liquid crystal layer on the display substrate falls within an area surrounded by the orthographic projection of the sealant on the display substrate.

A display device provided by an embodiment of the present disclosure includes the display panel provided by an embodiment of the disclosure.

BRIEF DESCRIPTION OF DRAWINGS

In order to more clearly illustrate the technical solutions in the embodiments of the present disclosure, the following is a brief description of the accompanying drawings to be used in the description of the embodiments. It will be apparent that the accompanying drawings in the following description are only some embodiments of the present disclosure, for those of ordinary skills in the art, other accompanying drawings may be obtained from these accompanying drawings, without paying any inventive effort.

DETAILED DESCRIPTION

In order to make objectives, technical solutions and advantages of the embodiments of the in present disclosure more clear, the technical solutions of the embodiments of the present disclosure will be clearly and completely described below with reference to the drawings of the embodiments of the present disclosure. Apparently, the described embodiments are a part of the embodiments of the present disclosure, not all of the embodiments. Furthermore, without a conflict, embodiments in the present disclosure and features in the embodiments may be combined with each other. Based on the described embodiments of the present disclosure, all other embodiments obtained by those of ordinary skills in the art without inventive effort are within the protection scope of the present disclosure.

Unless otherwise defined, technical terms or scientific terms used in the present disclosure should have the meanings as commonly understood by those of ordinary skills in the art that the present disclosure belongs to. The "first", "second" and similar terms used in the present disclosure do not indicate any order, quantity, or importance, but are used only for distinguishing different components. "Include", "contain", or similar words mean that elements or objects appearing before the words cover elements or objects listed after the words and their equivalents, but do not exclude other elements or objects. "Connect", "couple", or a similar term is not limited to a physical or mechanical connection, but may include an electrical connection, whether direct or indirect.

It should be noted that sizes and shapes of various figures in the drawings do not reflect real proportions, and are only for the purpose of schematically illustrating contents of the present disclosure. Moreover, the same or similar elements or the elements having same or similar functions are denoted by same or similar reference numerals throughout the descriptions.

Embodiments of the present disclosure provide a display substrate, as shown in FIG. 1, FIG. 2, FIG. 3 and FIG. 4. The display substrate includes a base substrate 1, a plurality of signal lines 4 and a plurality of fanout lines 5.

Figure 1:
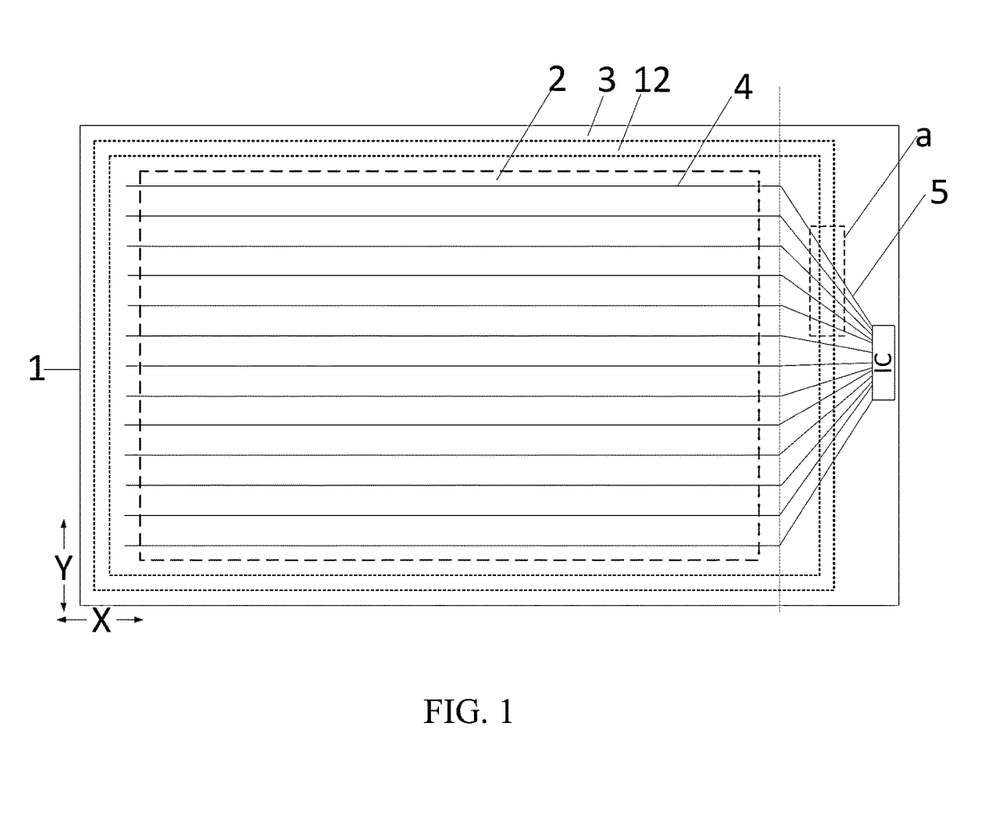
FIG. 1 is a schematic diagram of a display substrate according to an embodiment of the present disclosure.

The base substrate 1 includes a display area 2 and a peripheral area 3 located outside the display area 2; and the peripheral area includes a gluing area 12.

The plurality of signal lines 4 are located on a side of the base substrate 1, and each of the plurality of signal lines 4 extends from the display area 2 to the peripheral area 3.

The plurality of fanout lines 5 are located on a same side of the base substrate 1 as the signal lines 4, arranged in the peripheral area 3, and connected with the signal lines 4 in one-to-one correspondence.

Herein, the fanout line 5 includes a first fanout line 6 and a second fanout line 7.

Figure 2:
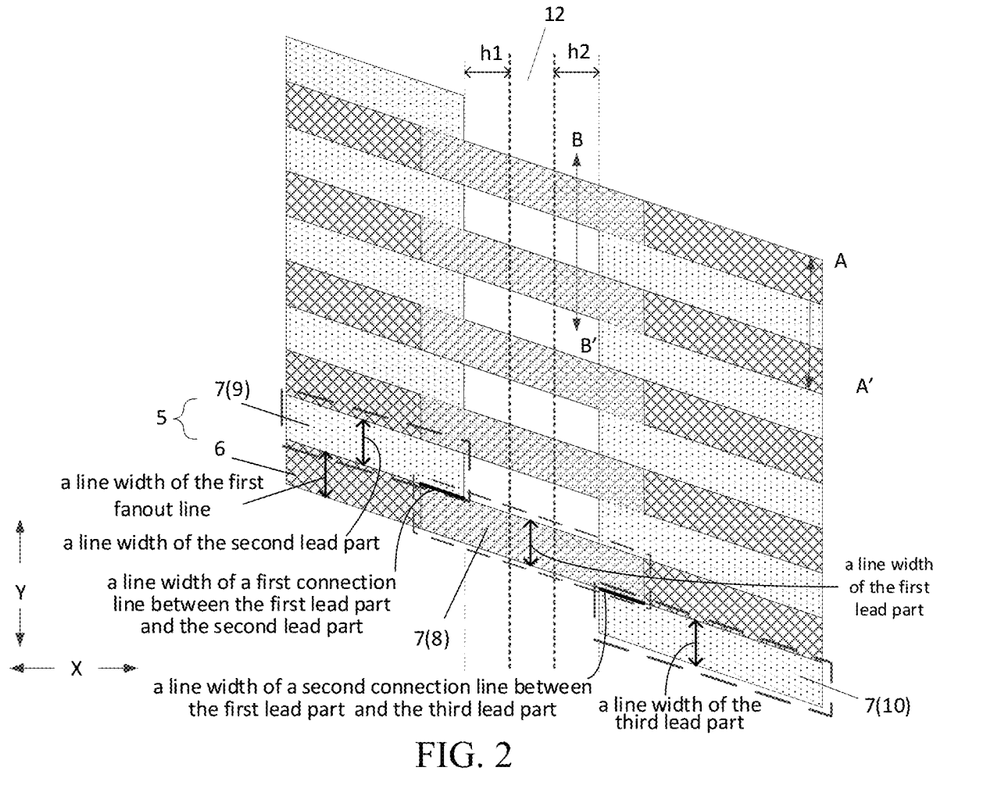
FIG. 2 is a schematic diagram of a structure of an area a in FIG. 1 according to an embodiment of the present disclosure.
Figure 3:
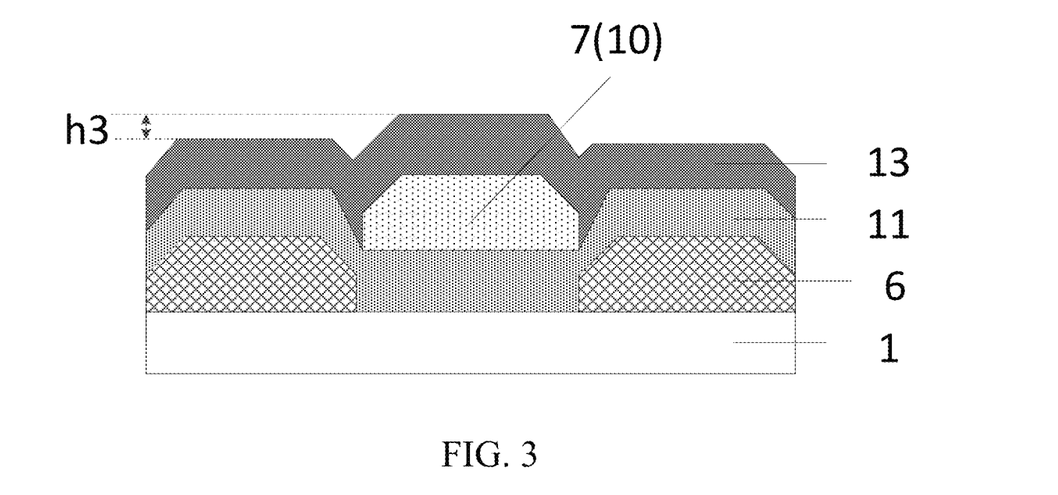
FIG. 3 is a cross-sectional view taken along AA' in FIG. 2 according to an embodiment of the present disclosure.
Figure 4:
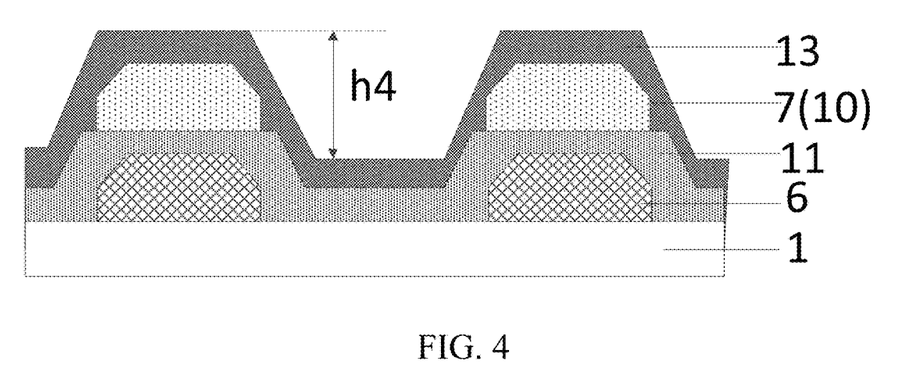
FIG. 4 is a cross-sectional view taken along BB' in FIG. 2 according to an embodiment of the present disclosure.

The second fanout line 7 is located on a side of the first fanout line 6 away from the base substrate 1. At least in the gluing area 12, an orthographic projection of the second fanout line 7 on the base substrate 1 substantially overlaps an orthographic projection of the first fanout line 6 on the base substrate 1. In part of an area outside the gluing area 12, an orthographic projection of the second fanout line 7 on the base substrate 1 and an orthographic projection of the first fanout line 6 on the base substrate 1 have a non-overlapping area, and a dimension of an overlapping area of the orthographic projection of the second fanout line 7 on the base substrate 1 and the orthographic projection of the first fanout line 6 on the base substrate 1 in a direction perpendicular to an extension direction of the fanout lines is smaller than a first preset threshold.

It should be noted that FIG. 1 shows only a positional relationship of signal lines and fanout lines by means of simple lines, FIG. 2 may be, for example, a schematic diagram of a structure of the area a in FIG. 1, FIG. 3 may be, for example, a cross-sectional view taken along AA' in FIG. 2, and FIG. 4 may be, for example, a cross-sectional view taken along BB' in FIG. 2.

It should be noted that, taking into account a process error in the manufacturing process of the display substrate, it may result in that the orthographic projection of the second fanout line on the base substrate does not strictly overlap the orthographic projection of the first fanout line on the base substrate in the gluing area, that is, the orthographic projection of the second fanout line on the base substrate substantially overlaps the orthographic projection of the first fanout line on the base substrate, which means that an area where the orthographic projection of the second fanout line on the base substrate and the orthographic projection of the first fanout line on the base substrate do not overlap is within an error range.

It should be noted that in part of an area outside the gluing area, the orthographic projection of the second fanout line on the base substrate and the orthographic projection of the first fanout line on the base substrate have a non-overlapping area, that is, the first fanout line and the second fanout line are alternately arranged. Similarly, taking into account the process error in the manufacturing process of the display substrate, the orthographic projection of the second fanout line on the base substrate and the orthographic projection of the first fanout line on the base substrate may not be completely non-overlapped in part of the area outside the gluing area, i.e., taking into account the process error, in part of the area outside the gluing area, a dimension of an overlapping area of the orthographic projection of the second fanout line on the base substrate and the orthographic projection of the first fanout line on the base substrate in a direction perpendicular to the extension direction of the fanout lines is smaller than a first preset threshold, which may be, for example, a maximum process error.

In the display substrate according to an embodiment of the present disclosure, each fanout line is wired in a double-layer mode by a first fanout line and a second fanout line, and each fanout line includes a part where the orthographic projection of the first fanout line on the base substrate substantially overlaps the orthographic projection of the second fanout line on the base substrate and a part where the first fanout line and the second fanout line are alternately arranged. The orthographic projection of the first fanout line on the base substrate substantially overlaps the orthographic projection of the second fanout line on the base substrate in the gluing area, so that the light transmittance in an area where the orthographic projection of the first fanout line on the base substrate and the orthographic projection of the second fanout line on the base substrate are overlapped is higher than that in an area where the orthographic projection of the first fanout line on the base substrate and the orthographic projection of the second fanout line on the base substrate are alternately arranged. Therefore, the curing effect of the sealant arranged in the gluing area can not be affected. In addition, since the fanout line includes the part where the first fanout line and the second fanout line are alternately arranged, the capacitance between the two layers of fanout lines can be avoided while the curing effect of the sealant is not affected, and the overall power consumption of the display product can be reduced.

In some embodiments, taking into account process errors, for example, it may be arranged that in part of the area outside the gluing area, the orthographic projection of the second fanout line on the base substrate and the orthographic projection of the first fanout line on the base substrate have an overlapping area only at the edges.

In some embodiments, the first preset threshold is zero. That is, in part of the area outside the gluing area, the orthographic projection of the second fanout line on the base substrate and the orthographic projection of the first fanout line on the base substrate do not overlap each other.

In some embodiments, as shown in FIG. 2, the second fanout line 7 includes a first lead part 8, a second lead part 9, and a third lead part 10. One terminal of the first lead part 8 is connected with the second lead part 9, and the other terminal of the first lead part 8 is connected with the third lead part 10.

An orthographic projection of the first lead part 8 on the base substrate overlaps the gluing area 12, and both an orthographic projection of the second lead part 9 on the base substrate and an orthographic projection of the third lead part 10 on the base substrate do not overlap the gluing area 12.

That is, the orthographic projection of the first lead part on the base substrate substantially overlaps the orthographic projection of the first fanout line on the base substrate, and both the orthographic projection of the second lead part on the base substrate and the orthographic projection of the third lead part on the base substrate have an overlapping area with the orthographic projection of the first fanout line on the base substrate, and the overlapping areas have a dimension in a direction perpendicular to the extension direction of the fanout lines smaller than a first preset threshold. In some embodiments, when the first preset threshold is 0, both the orthographic projection of the second lead part on the base substrate and the orthographic projection of the third lead part on the base substrate do not overlap the orthographic projection of the first fanout line on the base substrate.

In some embodiments, as shown in FIGS. 2, 3, and 4, the orthographic projection of the first lead part 8 on the base substrate overlaps the orthographic projection of the first fanout line 6 on the base substrate, and both the orthographic projection of the second lead part 9 on the base substrate and the orthographic projection of the third lead part 10 on the base substrate do not overlap the orthographic projection of the first fanout line 6 on the base substrate.

In the display substrate according to an embodiment of the present disclosure, the orthographic projection of the first lead part on the base substrate overlaps the orthographic projection of the first fanout line on the base substrate, so that the light transmittance of the gluing area can be improved to the maximum extent, and the curing effect of the sealant arranged in the gluing area can not be affected.

In some embodiments, as shown in FIGS. 2 and 3, the orthographic projection of the second lead part 9 on the base substrate is connected with the orthographic projections of two adjacent first fanout line lines 6 on the base substrate, and the orthographic projections of the third lead part 10 on the base substrate is connected with the orthographic projections of two adjacent first fanout line lines 6 on the base substrate.

In the display substrate according to an embodiment of the present disclosure, the orthographic projection of the second lead part on the base substrate is connected with the orthographic projections of two adjacent first fanout lines on the base substrate, and the orthographic projection of the third lead part on the base substrate is connected with the orthographic projections of two adjacent first fanout lines on the base substrate, i.e., each of the line widths of the second lead part and the third lead part is equal to a distance between two adjacent first fanout lines, and the second lead part and the third lead part cover a gap between two adjacent first fanout lines. Thus, the line widths of the first and second fanout lines can be maximized while the second and third lead parts are prevented from overlapping the first fanout lines, thereby reducing the resistance of the fanout lines and reducing the power consumption of the display product.

In some embodiments, as shown in FIG. 2, the line widths of the first fanout line 6 are equal at different positions. That is, the first fanout line is linear.

In some embodiments, as shown in FIG. 2, the line width of the first lead part 8, the line width of the second lead part 9 and the line width of the third lead part 10 are all equal. The line width of the connection portion between the first lead part 8 and the second lead part 9 is larger than that of the first lead part 8, and the line width of the connection portion between the first lead part 8 and the third lead part 10 is larger than that of the first lead part 8.

The second fanout line 7 shown in FIG. 2 is of a polyline type.

In some embodiments, the first lead part, the second lead part and the third lead part of the second fanout line are integrally connected.

It should be noted that FIG. 2 is illustrated by taking a case where the first fanout line is linear and the second fanout line is of a polyline type as an example. Of course, in specific implementations, the first fanout line may be of a polyline type and the second fanout line may be linear, i.e., the line widths of the second fanout line at different positions are equal. The first fanout line includes a fourth lead part, a fifth lead part and a sixth lead part, one terminal of the fourth lead part is connected with the fifth lead part, the other terminal of the fourth lead part is connected with the sixth lead part, an orthographic projection of the fourth lead part on the base substrate overlaps an orthographic projection of the second fanout line overlaps, and the orthographic projections of the fifth lead part and the sixth lead part on the base substrate do not overlap the orthographic projection of the second fanout line on the base substrate.

In some embodiments, as shown in FIG. 2, the line width of the first lead part 8, the line width of the second lead part 9, and the line width of the third lead part 10 are all equal to the line width of the first fanout line 6.

In some embodiments, the line widths of the first fanout line, the first lead part, the second lead part, and the third lead part are greater than or equal to 3 microns and less than or equal to 10 microns.

In some embodiments, as shown in FIG. 2, in the extension direction of the signal lines, a minimum distance h1 between an edge of the gluing area 12 and the second lead part 9 is greater than zero, and a minimum distance h2 between an edge of the gluing area 12 and the third lead part 10 is greater than zero.

In this way, the first lead part includes not only a part where its orthographic projection overlaps the gluing area, but also a part located at two sides of the gluing area in the extension direction of the second fanout lines, that is, the first lead part is arranged through the gluing area. Since the first lead part and the first fanout line are substantially overlapped, the light transmittance of the gluing area and its vicinity can be ensured, thereby ensuring the curing effect of the sealant to the maximum extent.

In some embodiments, in the extension direction of the signal lines, the minimum distance h1 between the edge of the gluing area 12 and the second lead part 9 is equal to the minimum distance h2 between the edge of the gluing area 12 and the third lead part 10.

In some embodiments, in the extension direction of the signal lines, the minimum distance h1 between the edge of the gluing area 12 and the second lead part 9 is greater than 0 micron and less than or equal to 200 microns, and the minimum distance h2 between the edge of the gluing area 12 and the third lead part 10 may also be greater than 0 micron and less than or equal to 200 microns.

In some embodiments, as shown in FIGS. 3 and 4, the display substrate further includes a first insulating layer 11 and a second insulating layer 13.

The first insulating layer 11 is located between the first fanout line 6 and the second fanout line 7.

The second insulating layer 13 is located on a side of the second fanout line 7 away from the first fanout line 6. The second insulating layer 13 has a first segment difference h4 and a second segment difference h3. The first difference h4 is a distance between a surface on a side of the second insulating layer 13 covering the second fanout line 7 away from the base substrate 1 and a surface on a side of the second insulating layer 13 between adjacent second fanout lines 7 away from the base substrate 1 in an area where the orthographic projection of the second fanout line 7 on the base substrate 1 does not overlap the orthographic projection of the first fanout line 6 on the base substrate 1. The second segment difference h3 is a distance between a surface on a side of the second insulating layer 13 covering the second fanout line 7 away from the base substrate 1 and a surface on a side of the second insulating layer 13 between adjacent second fanout lines 7 away from the base substrate 1 in the gluing area. The second section difference h3 is smaller than the first section difference h4.

It should be noted that when the display substrate is applied to a display product, it is required to coat sealant on the gluing area of the surface on a side of the display substrate away from its base substrate, and the coating of the sealant can protect fanout lines covered by it, thus reducing the risk of scratching the fanout lines. However, the fanout lines in the area not covered by sealant have a high risk of being scratched.

The display substrate according to an embodiment of the present disclosure includes an area where the first fanout line and the second fanout line do not overlap each other, thereby reducing the second segment difference, improving the flatness of the area outside the gluing area of the display substrate, improving the scratch resistance of the fanout lines in the area outside the gluing area, and improving a yield of the display substrate.

In some embodiments, as shown in FIG. 1, a side of the fanout line 5 away from the display area 2 is electrically connected with a driver chip IC. Therefore, a signal may be provided to the signal line through the fanout line using the driver chip IC.

It should be noted that FIG. 1 is illustrated by taking a case where a fanout line is provided on a side of the extension direction of the signal line as an example. Of course, in the specific implementation, fanout lines may also be provided in the peripheral area on two sides of the extension direction of the signal line. In FIG. 1, the signal line includes a signal line extending in a first direction X, and a fanout line is electrically connected with the signal line extending in the first direction X.

In some embodiments, the signal lines are data signal lines; the data signal lines are located between the first insulating layer and the second insulating layer and are arranged on the same layer as the second fanout lines.

Each second fanout line is electrically connected with a data signal line, and each first fanout line is electrically connected with a data signal line.

The display substrate further includes a plurality of scanning signal lines, located on a side of the first insulating layer facing the base substrate and disposed in the same layer as the first fanout lines.

In a specific implementation, since the first fanout lines and the data signal lines are located in different layers, the first fanout line needs to be electrically connected with the data signal lines through vias penetrating the first insulating layer.

In a specific implementation, the scanning signal line extends from the display area to the peripheral area, and the plurality of scanning signal lines and the plurality of data signal lines are intersected, and the plurality of scanning signal lines and the data signal lines divide the display area into a plurality of sub-pixels. The signal lines 4 in FIG. 1 are data signal lines. The scanning signal line may extend, for example, in a second direction Y, i.e., the scanning signal line is perpendicular to the data signal line.

In some embodiments, each sub-pixel includes a thin film transistor and a pixel electrode. The thin film transistor includes a gate electrode, a source electrode, a drain electrode and an active layer. The gate electrode of the thin film transistor is arranged in the same layer as the scanning signal line and the first fanout line and electrically connected with the scanning signal line and the first fanout line. The source electrode and the drain electrode of the thin film transistor are arranged in the same layer as the data signal line and the second fanout line, and the source electrode of the thin film transistor is electrically connected with the data line. The pixel electrode is located on a side of the data line away from the base substrate, and is electrically connected with the drain electrode of the thin film transistor.

In a specific implementation, the thin film transistor may be of a top gate structure, i.e., an active layer is located between the gate electrode and the base substrate. Of course, the thin film transistor can also be of a bottom gate structure, i.e., the active layer is located between the gate electrode, and the source and drain electrodes.

In some embodiments, the display substrate may also include a common electrode. The common electrode is located, for example, on a side of the pixel electrode away from the base substrate.

Figure 5:
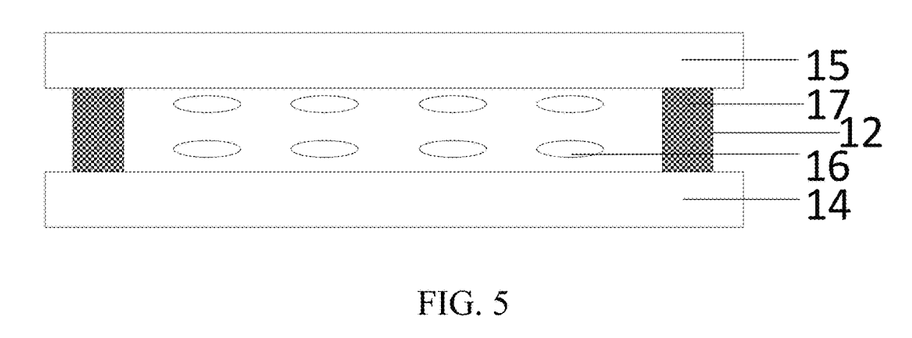
FIG. 5 is a schematic diagram of a structure of a panel according to an embodiment of the present disclosure.

An embodiment of the present disclosure also provides a display panel, as shown in FIG. 5, including the display substrate 14 according to the embodiment of the present disclosure, an alignment substrate 15, a liquid crystal layer 16 and a sealant 17.

The alignment substrate 15 is located on a side of the second conductive layer away from the base substrate.

The liquid crystal layer 16 is located between the display substrate 14 and the alignment substrate 15.

The sealant 17 is located between the display substrate 14 and the alignment substrate 15. An orthographic projection of the sealant 17 on the display substrate 14 overlaps an encapsulation area, and an orthographic projection of the liquid crystal layer 16 on the display substrate 14 falls within an area surrounded by the orthographic projection of the sealant 17 on the display substrate 14.

That is, the display panel according to an embodiment of the present disclosure is a liquid crystal display panel.

In some embodiments, the opposing substrate includes, for example, a color film and a black matrix. An orthographic projection of the black matrix on the base substrate of the display substrate covers an orthographic projection of the scanning lines on the base substrate and an orthographic projection of the data lines on the base substrate. An opening area of the black matrix corresponds to a light emitting area of the sub-pixel. The color film includes a filter corresponding to color of the sub-pixel. For example, the sub-pixel includes a red sub-pixel, a blue sub-pixel, and a green sub-pixel, and correspondingly, the color film includes a red filter, a blue filter, and a green filter. In some embodiments, when the display substrate does not include a common electrode, the alignment substrate further includes a common electrode.

Figure 6:
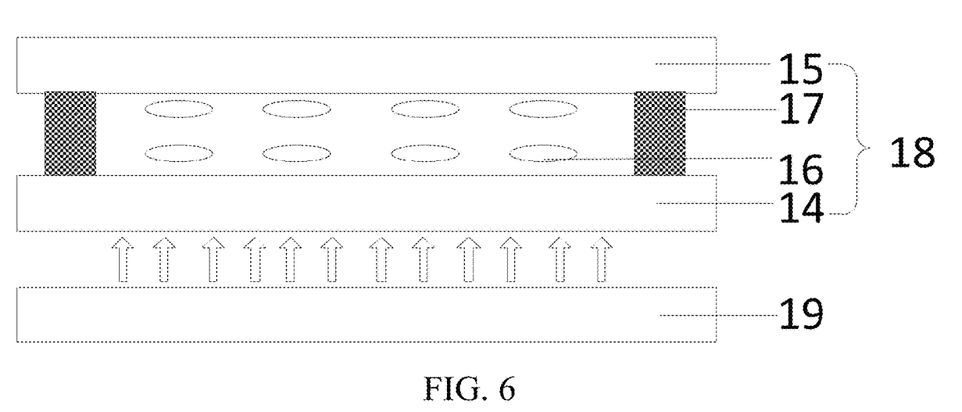
FIG. 6 is a schematic diagram of a structure of a display device according to an embodiment of the present disclosure.

An embodiment of the present disclosure also provides a display device. As shown in FIG. 6, the display device includes a display panel 18 according to an embodiment of the present disclosure.

In some embodiments, as shown in FIG. 6, the display device further includes a backlight module 19. The display panel 18 is located on a light exit side of the backlight module 19.

The display device provided by the embodiment of the present disclosure is any product or component with a display function, such as mobile phone, tablet computer, television, display, notebook computer, digital photo frame, navigator, etc. Other essential components included in the display device should be understood to be included in the display device by those of ordinary skill in the art, and will not be described repeatedly herein. They should not be taken as a limitation on the present disclosure. The implementation of the display device can refer to the above embodiments of the display substrate as well as the embodiments of the display panel, and the repetition will not be described.

In summary, in the display substrate, the display panel and the display device according to embodiments of the present disclosure, each fanout line is wired in a double-layer mode by a first fanout line and a second fanout line, and each fanout line includes a part where the orthographic projection of the first fanout line on the base substrate substantially overlaps the orthographic projection of the second fanout line on the base substrate and a part where the first fanout line and the second fanout line are alternately arranged, and the orthographic projection of the first fanout line on the base substrate substantially overlaps the orthographic projection of the second fanout line on the base substrate in the gluing area, so that the light transmittance in the area where the orthographic projection of the first fanout line on the base substrate overlaps the orthographic projection of the second fanout line on the base substrate is higher than that in the area where the first fanout line on and the second fanout line are alternately arranged. Therefore, the curing effect of the sealant arranged in the gluing area can not be affected. In addition, since the fanout line includes the part where the first fanout line and the second fanout line are alternately arranged, the capacitance between the two layers of fanout lines can be avoided while the curing effect of the sealant is not affected, and the overall power consumption of the display product can be reduced.

Although preferred embodiments of the present invention have been described, those skilled in the art may make additional changes and modifications to these embodiments once the basic inventive concepts are known. Therefore, the appended claims are intended to be interpreted to encompass preferred embodiments as well as all changes and modifications falling within the scope of the present invention.

Apparently, various modifications and variations to the embodiments of the present invention may be made by those skilled in the art without departing from the spirit and scope of the embodiments of the present invention. Thus, if these modifications and variations to embodiments of the present invention fall within the scope of the claims of the present invention and their equivalent techniques, the present invention is intended to include these modifications and variations.

The invention claimed is:

1. A display substrate, comprising:
   a base substrate, comprising a display area and a peripheral area located outside the display area; wherein the peripheral area comprises a gluing area;
   a plurality of signal lines, located on a side of the base substrate, wherein each of the signal lines extends from the display area to the peripheral area;
   a plurality of fanout lines, located on a same side of the base substrate as the signal lines, wherein the plurality of fanout lines are provided in the peripheral area and are connected with the plurality of signal lines in a one-to-one correspondence;
   wherein, a fanout line comprises:
   a first fanout line;
   a second fanout line, located on a side of the first fanout line away from the base substrate; wherein at least in the gluing area, an orthographic projection of the second fanout line on the base substrate substantially overlaps an orthographic projection of the first fanout line on the base substrate; in part of an area outside the gluing area, the orthographic projection of the second fanout line on the base substrate and the orthographic projection of the first fanout line on the base substrate have a non-overlapping area, and a dimension of an overlapping area of the orthographic projection of the second fanout line on the base substrate and the orthographic projection of the first fanout line on the base substrate in a direction perpendicular to an extension direction of the fanout line is smaller than a first preset threshold; and
   the display substrate further comprises:
   a first insulating layer, located between the first fanout line and the second fanout line;
   a second insulating layer, located on a side of the second fanout line away from the first fanout line; wherein the second insulating layer has a first segment difference and a second segment difference;
   wherein, the first segment difference is a distance between a surface on a side of the second insulating layer covering the second fanout line away from the base substrate and a surface on a side of the second insulating layer between adjacent second fanout lines away from the base substrate in an area where the orthographic projection of the second fanout line on the base substrate does not overlap the orthographic projection of the first fanout line on the base substrate;
   the second segment difference is a distance between a surface on a side of the second insulating layer covering the second fanout line away from the base substrate and a surface on a side of the second insulating layer between adjacent second fanout lines away from the base substrate in the gluing area; the second segment difference is smaller than the first segment difference.

2. The display substrate according to claim 1, wherein the second fanout line comprises: a first lead part, a second lead part, and a third lead part;
   one terminal of the first lead part is connected with the second lead part, and the other terminal of the first lead part is connected with the third lead part;
   an orthographic projection of the first lead part on the base substrate and the gluing area have an overlapping area, and both an orthographic projection of the second lead part on the base substrate and an orthographic projection of the third lead part on the base substrate do not overlap the gluing area.

3. The display substrate according to claim 2, wherein the orthographic projection of the first lead part on the base substrate overlaps the orthographic projection of the first fanout line on the base substrate, and both the orthographic projection of the second lead part on the base substrate and the orthographic projection of the third lead part on the base substrate do not overlap the orthographic projection of the first fanout line on the base substrate.

4. The display substrate according to claim 3, wherein the orthographic projection of the second lead part on the base substrate is connected with orthographic projections of two adjacent first fanout line lines on the base substrate, and the orthographic projection of the third lead part on the base substrate is connected with orthographic projections of two adjacent first fanout line lines on the base substrate.

5. The display substrate according to claim 2, wherein line widths of the first fanout line at different positions are equal; a line width of the first lead part, a line width of the second lead part and a line width of the third lead part are all equal; a line width of a first connection line between the first lead part and the second lead part is larger than the line width of the first lead part, and a line width of a second connection line between the first lead part and the third lead part is larger than the line width of the first lead part.

6. The display substrate according to claim 5, wherein the line width of the first lead part, the line width of the second lead part, and the line width of the third lead part are equal to the line width of the first fanout line.

7. The display substrate according to claim 6, wherein the line width of the first fanout line, and line widths of the first lead part, the second connection lead part, and the third lead part are greater than or equal to 3 microns and less than or equal to 10 microns.

8. The display substrate according to claim 2, wherein, in an extension direction of the signal lines, a minimum distance between an edge of the gluing area and the second lead part is greater than zero, and a minimum distance between the edge of the gluing area and the third lead part is greater than zero.

9. The display substrate according to claim 8, wherein, in the extension direction of the signal lines, a minimum distance between the edge of the gluing area and the second lead part is equal to a minimum distance between the edge of the gluing area and the third lead part.

10. The display substrate according to claim 8, wherein, in the extension direction of the signal lines, a minimum distance between the edge of the gluing area and the second lead part is greater than 0 microns and less than or equal to 200 microns, and a minimum distance between the edge of the gluing area and the third lead part is greater than 0 microns and less than or equal to 200 microns.

11. The display substrate according to claim 1, wherein the signal lines are data signal lines; the data signal lines are located between the first insulating layer and the second insulating layer and are disposed in a same layer as the second fanout lines;
- each of the second fanout lines is electrically connected with one of the data signal lines, and each of the first fanout lines is electrically connected with one of the data signal lines;
- the display substrate further comprises:
- a plurality of scanning signal lines, located on a side of the first insulating layer facing the base substrate, wherein the plurality of scanning signal lines are disposed in a same layer as the first fanout lines.

12. A display panel, comprising:
- the display substrate according to claim 1;
- an alignment substrate located on a side of the second conductive layer away from the base substrate;
- a liquid crystal layer located between the display substrate and the alignment substrate;
- sealant located between the display substrate and the alignment substrate; wherein an orthographic projection of the sealant on the display substrate overlaps the gluing area, and an orthographic projection of the liquid crystal layer on the display substrate falls within an area surrounded by the orthographic projection of the sealant on the display substrate.

13. A display device comprising the display panel of claim 12.

14. The display substrate according to claim 11, wherein the first fanout line is electrically connected with the data signal lines through vias penetrating the first insulating layer.

15. The display substrate according to claim 11, wherein the plurality of scanning signal lines and the data signal lines divide the display area into a plurality of sub-pixels, and each sub-pixel comprises a thin film transistor and a pixel electrode.

16. The display substrate according to claim 15, wherein the thin film transistor comprises a gate electrode, a source electrode, a drain electrode and an active layer, the gate electrode of the thin film transistor is arranged in a same layer as the scanning signal line and the first fanout line and electrically connected with the scanning signal line and the first fanout line; the source electrode and the drain electrode of the thin film transistor are arranged in a same layer as the data signal line and the second fanout line, and the source electrode of the thin film transistor is electrically connected with the data line.

17. The display substrate according to claim 15, wherein the thin film transistor is of a top gate structure or a bottom gate structure.

18. The display substrate according to claim 1, wherein the second fanout line is of a polyline type.

19. The display substrate according to claim 2, wherein the first lead part, the second lead part and the third lead part of the second fanout line are integrally connected.

* * * * *